US012111360B2

(12) United States Patent
Yang et al.

(10) Patent No.: US 12,111,360 B2
(45) Date of Patent: Oct. 8, 2024

(54) BATTERY PACK AND POWER SUPPLY APPARATUS

(71) Applicant: Nanjing Chervon Industry Co., Ltd., Nanjing (CN)

(72) Inventors: Dong Yang, Nanjing (CN); Zhaotao Zhang, Nanjing (CN); Junya Duan, Nanjing (CN); Zhongcao Hu, Nanjing (CN)

(73) Assignee: Nanjing Chervon Industry Co., Ltd., Nanjing (CN)

( * ) Notice: Subject to any disclaimer, the term of this patent is extended or adjusted under 35 U.S.C. 154(b) by 348 days.

(21) Appl. No.: 17/583,414

(22) Filed: Jan. 25, 2022

(65) Prior Publication Data

US 2022/0244314 A1 Aug. 4, 2022

(30) Foreign Application Priority Data

Feb. 4, 2021 (CN) .......................... 202110152010.7

(51) Int. Cl.
*G01R 31/36* (2020.01)
*B25F 5/02* (2006.01)
(Continued)

(52) U.S. Cl.
CPC ............ *G01R 31/3648* (2013.01); *B25F 5/02* (2013.01); *H01M 10/44* (2013.01);
(Continued)

(58) Field of Classification Search
CPC ............ G01R 31/3648; H01M 10/44; H01M 10/425; H01M 10/441; H01M 10/482; H01M 50/204; H01M 2010/4271; H01M 2220/30; B25F 5/02; H02J 7/00034; H02J 7/0044; H02J 7/0047; H02J 7/0063; H02J 7/00712; H02J 7/00714
(Continued)

(56) References Cited

U.S. PATENT DOCUMENTS 10,868,342 B2 * 12/2020 Tanaka ................ H01M 10/443
2019/0054837 A1 2/2019 Tanaka et al.
(Continued)

FOREIGN PATENT DOCUMENTS

CN 105356528 A 2/2016
CN 112117480 A 12/2020
(Continued)

*Primary Examiner* — John H Le
(74) *Attorney, Agent, or Firm* — Greenberg Traurig, LLP (57) ABSTRACT

A battery pack includes a plurality of cells, a first detection unit configured to detect a first electrical parameter of a cell, a second detection unit configured to detect a second electrical parameter of a cell group, a storage unit at least configured to store a third electrical parameter of the cell, and a control unit configured to acquire the first electrical parameter, the second electrical parameter, and the third electrical parameter, dynamically adjust a discharge capacity parameter of the battery pack based on the third electrical parameter, the first electrical parameter, and the second electrical parameter, and transmit the discharge capacity parameter to a load connected to the battery pack to enable the load to adjust the current operating state based on the discharge capacity parameter.

20 Claims, 5 Drawing Sheets

(51) Int. Cl.
   *H01M 10/44* (2006.01)
   *H01M 50/204* (2021.01)
   *H02J 7/00* (2006.01)

(52) U.S. Cl.
   CPC ......... *H01M 50/204* (2021.01); *H02J 7/0044* (2013.01); *H02J 7/00714* (2020.01); *H01M 2220/30* (2013.01)

(58) Field of Classification Search
   USPC .......................................................... 702/63
   See application file for complete search history.

(56) References Cited

U.S. PATENT DOCUMENTS

| | | |
|---|---|---|
| 2019/0157883 A1 | 5/2019 | Yen |
| 2019/0363566 A1 | 11/2019 | Yen |

FOREIGN PATENT DOCUMENTS

| | | |
|---|---|---|
| CN | 112180276 A | 1/2021 |
| WO | 2018050031 A1 | 3/2018 |

* cited by examiner

BATTERY PACK AND POWER SUPPLY APPARATUS

RELATED APPLICATION INFORMATION

This application claims the benefit under 35 U.S.C. § 119(a) of Chinese Patent Application No. CN 202110152010.7, filed on Feb. 4, 2021, which application is incorporated herein by reference in its entirety.

BACKGROUND

As a power supply of a power tool, a battery pack transmits a parameter representing the discharge capacity of the battery pack to the power tool when supplying power to the power tool so that the power tool operates under the guidance of the parameter. The parameter representing the discharge capacity of the battery pack may be the maximum discharge current of the battery pack, the maximum discharge voltage of the battery pack, or the maximum output power of the battery pack.

However, in the case where the parameter representing the discharge capacity provided by the battery pack is relatively large and the actual parameter representing the actual discharge capacity of the battery pack is lower than the parameter representing discharge capacity, the power tool still acquires power from the battery pack according to parameter representing the discharge capacity so that the battery pack is in an overloaded operating state and the life of the battery pack is affected. In the case where the parameter representing discharge capacity provided by the battery pack is relatively small and the actual parameter representing the actual discharge capacity of the battery pack is higher than the parameter representing discharge capacity, the tool also acquires power from the battery pack according to the parameter representing the discharge capacity so that the battery pack cannot exert the actually optimal power supply capacity.

SUMMARY

In one example, a battery pack includes a cell group including a plurality of cells, a first detection unit configured to detect a first electrical parameter of a cell, a second detection unit configured to detect a second electrical parameter of the cell group, a storage unit at least configured to store a third electrical parameter of the cell, and a control unit at least electrically connected to the first detection unit, the second detection unit, and the storage unit. The control unit is configured to acquire the first electrical parameter, the second electrical parameter, and the third electrical parameter of the cell, dynamically adjust a discharge capacity parameter of the battery pack based on the third electrical parameter of the cell, the first electrical parameter, and the second electrical parameter, and transmit the discharge capacity parameter to a load end connected to the battery pack to enable the load to adjust the current operating state based on the discharge capacity parameter.

In one example, the first electrical parameter includes the voltage of the cell, and the second electrical parameter includes the output current on the power supply circuit of the cell group.

In one example, the third electrical parameter includes the internal resistance of the cell.

In one example, the control unit is configured to acquire the internal resistance of the cell by querying a table.

In one example, the control unit is configured to estimate the internal resistance of the cell based on a preset cell discharge model.

In one example, the battery pack includes a plurality of cell groups connected in parallel or in series. The control unit is configured to dynamically adjust the discharge capacity parameter based on the number of the cell groups connected in parallel, the first electrical parameter, the second electrical parameter, and the internal resistance of the cell.

In one example, a power supply apparatus includes a first detection unit configured to detect a first electrical parameter of the power supply apparatus, a second detection unit configured to detect a second electrical parameter of the power supply apparatus, a storage unit at least configured to store a third electrical parameter of the power supply apparatus, and a control unit at least electrically connected to the first detection unit, the second detection unit, and the storage unit. The control unit is configured to acquire the first electrical parameter, the second electrical parameter, and the third electrical parameter of the power supply apparatus, dynamically adjust a discharge capacity parameter of the power supply apparatus based on the third electrical parameter of the power supply apparatus, the first electrical parameter, and the second electrical parameter, and transmit the discharge capacity parameter to a load end connected to the power supply apparatus to enable the load to adjust the current operating state based on the discharge capacity parameter.

In one example, the first electrical parameter includes the voltage of the power supply apparatus, and the second electrical parameter includes the output current on the power supply circuit of the power supply apparatus.

In one example, the third electrical parameter includes the internal resistance of the power supply apparatus.

In one example, the control unit is configured to acquire the internal resistance of the power supply apparatus by querying a table.

In one example, the control unit is configured to estimate the internal resistance of the power supply apparatus based on a preset power discharge model.

In one example, the power supply apparatus includes one or more battery packs.

In one example, the battery packs are connected in parallel. The control unit is configured to dynamically adjust the discharge capacity parameter based on the number of the battery packs connected in parallel, the first electrical parameter, the second electrical parameter, and the third electrical parameter of the power supply apparatus.

In one example, a method for calculating the discharge capacity of a power supply apparatus is provided. The power supply apparatus includes a first detection unit configured to detect a first electrical parameter of the power supply apparatus, a second detection unit configured to detect a second electrical parameter of the power supply apparatus, and a storage unit at least configured to store a third electrical parameter of the power supply apparatus. The calculation method includes acquiring the first electrical parameter, the second electrical parameter, and the third electrical parameter of the power supply apparatus; dynamically adjusting a discharge capacity parameter of the power supply apparatus based on the third electrical parameter of the power supply apparatus, or the first electrical parameter, or the second electrical parameter; and transmitting the discharge capacity parameter to a load end connected to the power supply apparatus to enable the load to adjust the current operating state based on the discharge capacity parameter.

In one example, the first electrical parameter includes the voltage of the power supply apparatus, the second electrical parameter includes the output current on the power supply circuit of the power supply apparatus, and the third electrical parameter includes the internal resistance of the power supply apparatus.

The present disclosure has advantages that the load can adjust the operating state timely in different discharge capacities of a battery pack by constantly updating the parameter reflecting the discharge capacity of the battery pack to the load end, so that the battery pack constantly supplies power to the load within the range of the power supply capacity of the battery pack, preventing the life of the battery pack from being affected and guaranteeing the discharge performance of the battery pack.

DETAILED DESCRIPTION

The present disclosure is described hereinafter in detail in conjunction with drawings and examples. It is to be understood that the examples described herein are intended to illustrate and not to limit the present disclosure. Additionally, it is to be noted that for ease of description, only part, not all, of the structures related to the present disclosure are illustrated in the drawings.

In examples of the present disclosure, a power supply apparatus may be a battery pack, or another apparatus that can store and release electric energy. The power supply apparatus is detachably installed to a load and can supply electrical energy to the load. The load may be any direct-current or alternating-current power tool that can be powered by the power supply apparatus. For example, the load may be a speed-adjustable power tool, for example, a screwdriver, an electric drill, a wrench, or an angle grinder. In some examples, the load may be a power tool for polishing a workpiece, for example, a sander. In some examples, the load may be a cutting tool, for example, a reciprocating saw, a circular saw, or a jigsaw. In some examples, the load may be a power tool for impacting, for example, an electric hammer. In some examples, the load may be a gardening tool, for example, a pruning machine or a chainsaw.

Figure 1:
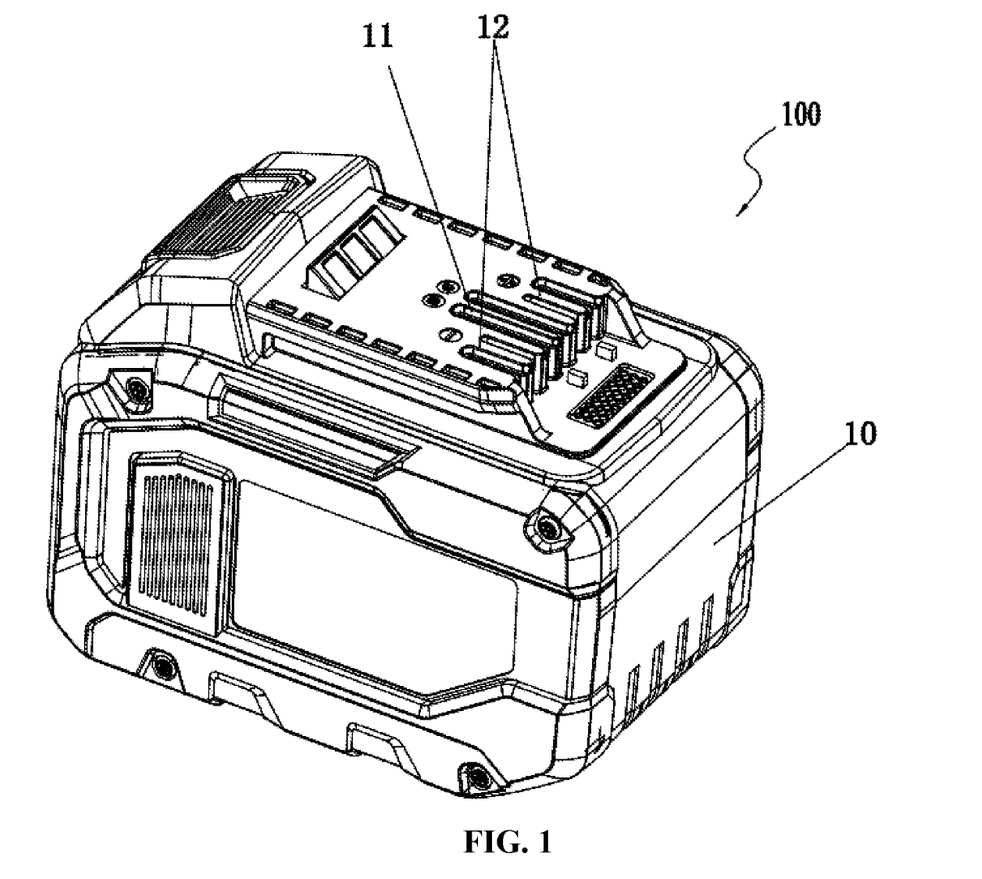
FIG. 1 is a view illustrating the structure of a battery pack.
Figure 2:
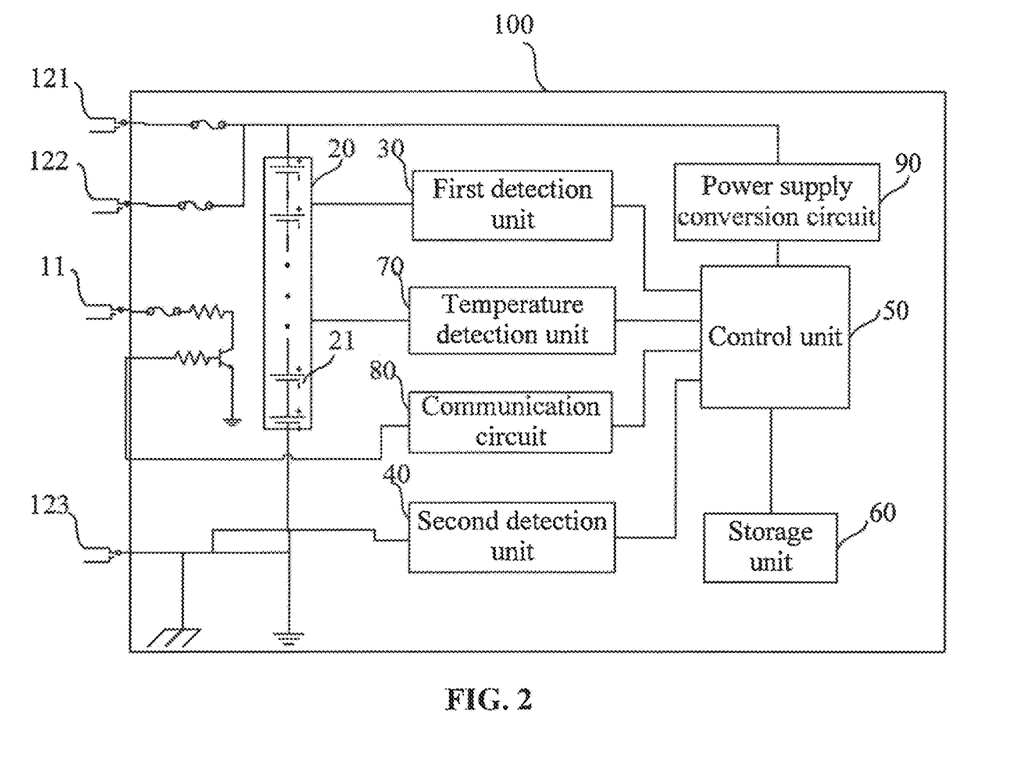
FIG. 2 is a circuit block diagram of a battery pack according to an example.

In one example, the power supply apparatus is a battery pack. The battery pack 100 as shown in FIG. 1 may include a housing 10, a communication terminal 11, and a power supply terminal 12. The communication terminal 11 and the power supply terminal 12 are disposed on the housing 10. As shown in FIGS. 1 and 2, the power supply terminal 12 includes a discharging positive terminal 121 of the battery pack 100, a charging positive charge 122 of the battery pack 100, and a negative terminal 123 of the battery pack 100. In one example, the battery pack 100 is a rechargeable battery pack, for example, a lithium battery pack. The battery pack 100 may further include a display apparatus, for example, an LED display screen.

The battery pack 100 mainly includes a cell group 20 including cells 21, a first detection unit 30, a second detection unit 40, a control unit 50, and a storage unit 60.

The cell group 20 is composed of a plurality of cells 21 connected in series to form a single power supply branch, thus forming a 1P battery pack. Alternatively, a plurality of cell groups are connected in parallel to form an NP battery pack. N denotes the number of cell groups connected in parallel. It is to be understood that all the cells 21 in the battery pack 100 have the same initial value of the internal resistance and that the cells 21 have the same performance parameters including the electric energy stored in each cell and the discharge capacity. In the present disclosure, it is considered that all the cells 21 have the same performance parameters in the operating process of the battery pack 100.

The first detection unit 30 may collect a first electrical parameter of a cell 21 according to a certain frequency. The collection at a certain frequency may be a real-time collection or the collection at regular intervals. That is, the first electrical parameter collected by the first detection unit 30 is a dynamically updating parameter and varies with the constant discharge of the battery pack 100.

The second detection unit 40 may collect a second electrical parameter of the cell group 20 according to a certain frequency. The collection at a certain frequency may be a real-time collection or the collection at regular intervals. That is, the second electrical parameter collected by the second detection unit 40 is a dynamically updating parameter and varies with the constant discharge of the battery pack 100.

In one example, the collection frequency of the first detection unit 30 may be the same as the collection frequency of the second detection unit 40.

In one example, the collection frequency of the first detection unit 30 may be different from the collection frequency of the second detection unit 40.

In one example, the first detection unit 30 may be a voltage detection element, for example, a voltage sensor. The first electrical parameter collected by the first detection unit 30 is the voltage of a single cell 21. The second detection unit 40 may be a current detection element, for example, a sampling resistor, a current transformer, a Hall current sensor, or a magnetic sensor. The second detection unit 40 may collect the output current on the power supply circuit of the cell group 20 to make the output current serve as the second electrical parameter.

The storage unit 60 may store a third electrical parameter related to the battery pack 100, for example, the initial internal resistance of the cell 21, the variation in the internal resistance of the cell 21 with an increasing times of discharges and increasing discharge duration, the voltage of the cell 21 detected each time, or the current output by the cell group 20 each time.

The battery pack 100 may further include a temperature collection unit 70, for example, a temperature sensor, to collect the surface temperature of the cell 21. In an example, the temperature collection unit 70 may include a module or element able to detect or estimate the internal temperature of the cell 21 so as to acquire the internal temperature of the cell 21. In one example, the temperature collection unit 70 may further include a temperature collection module or element able to collect the temperature of a circuit board in the battery pack 70.

The battery pack 100 may further include a communication circuit 80 connected between the communication terminal 11 and the control unit 50. The communication circuit 80 may implement data interaction between the battery pack 100 and a power tool based on a preset communication protocol. In one example, the communication circuit may implement bus communication, a serial port communication, or the communication of another type.

The battery pack 100 may further include a power supply conversion circuit 90. The power supply conversion circuit 90 is configured to convert the output electric energy of the cell group 20 to the electric energy for supplying power to the control unit 50.

The control unit 50 serves as a core computing and processing module of the battery pack 100 and is at least electrically connected to the first detection unit 30, the second detection unit 40, the storage unit 60, the temperature collection unit 70, the communication circuit 80, and the power supply conversion circuit 90. In one example, the control unit 50 may acquire the voltage of the cell 21 from the first detection unit 30, acquire the current on the power supply circuit from the second detection unit 40, and acquire the surface temperature of the cell 21, the internal temperature of the cell 21, or the temperature of the circuit board from the temperature collection unit 70. In the discharge process of the battery pack 100, the control unit 50 may perform discharge control based on the acquired parameters. The storage unit 60 may store the internal resistance corresponding to the cell 21 at different discharge stages. The control unit 50 may acquire the internal resistance of the cell 21 at different discharge stages from the storage unit 60 by querying a table. In one example, the control unit 50 may further estimate the current internal resistance of the cell 21 based on a preset cell discharge model. The cell discharge model may include the one or more relationships of electrical parameters related to the cell 21. For example, the cell discharge model includes the relationship between the internal resistance of the cell and, the discharge duration of the cell, the aging degree of the cell, the ambient temperature of the cell, or the number of charge-discharge cycles of the cell.

The discharge control performed by the control unit 50 for the battery pack 100 mainly includes the control in the first power-on and the control in the discharge process. In the case where the battery pack 100 is powered on for the first time, the control unit 50 may compare the relationship between a parameter, for example, the voltage of the cell, the surface temperature of the cell, or the temperature of the circuit board, and the threshold of the corresponding parameter so as to perform the power-off protection. The power-off protection is to control the battery pack 100 to stop discharging to the power tool. For example, the control unit 50 may perform the power-off protection in the case where the voltage of the cell 21 is smaller than a first voltage threshold so that the battery pack 100 stops discharging. Alternatively, the control unit 50 performs the power-off protection in the case where the surface temperature of the cell 21 is greater than a first temperature threshold. Alternatively, the power-off protection is triggered in the case where the temperature of the circuit board is greater than or equal to the temperature threshold of the circuit board. In the discharge process of the battery pack 100, the control unit 50 may perform the power-off protection in the case where the voltage of the cell 21 is smaller than or equal to a second voltage, may perform the power-off protection in the case where the surface temperature of the cell is greater than or equal to a second temperature threshold, or may trigger the power-off protection in the case where the internal temperature of the cell is greater than or equal to the internal temperature threshold. It is to be understood that the preceding first voltage threshold is greater than the second voltage threshold and that the first temperature threshold is smaller than the second temperature threshold. That is, the first power-on (that is, the initial discharge) of the battery pack 100 and the discharge process of the battery pack 100 need different reference thresholds for the power-off protection of the battery pack 100. Different power-off protection thresholds are set for different operating stages so that a more accurate power-off control is implemented.

The preceding discharge control belongs to the discharge protection control of the battery pack 100 and does not relate to the control of the discharge capacity of the battery pack 100. In fact, in the discharge process of the battery pack 100, the control unit 50 is further configured to control the discharge capacity of the battery pack 100. At the beginning of discharge, the battery pack 100 usually transmits a parameter (for example, the maximum discharge voltage, the maximum discharge current, or the maximum output power) representing the discharge capacity of the battery pack 100 and the model of the battery pack 100 or other parameters to the power tool. When confirming that parameters including the model of the battery pack 100 match the power required by the power tool, the power tool may use the power supplied by the battery pack 100 to operate. In the operating process of the power tool, it only needs to ensure that parameters including current or voltage of the battery pack 100 do not exceed the allowable range of a discharge capacity parameter of the battery pack 100. However, with the battery pack 100 discharging constantly or being affected by other factors including the environment, the discharge capacity of the battery pack 100 is affected. If the initially set discharge capacity parameter of the battery pack 100 is relatively large or within a relatively large range, in the case where the actual discharge capacity of the battery pack 100 reduces, the battery pack 100 will be in an overloaded operating state when the power tool continues to operate based on the previously received discharge capacity parameter of the battery pack 100. In this case, the service life of the battery pack 100 is reduced. If the initially set discharge capacity parameter is relatively small or within a relatively small range, the battery pack 100 cannot exert the optimal discharge capacity; that is, the battery pack 100 cannot supply power to the power tool with the maximum discharge capacity. In this case, the discharge performance of the battery pack 100 is affected.

To solve the preceding problem, the control unit 50 may calculate the discharge capacity parameter of the battery pack 100 based on the internal resistance of the cell 21, the voltage of the cell 21, and the output current of the cell group 20 and transmit the discharge capacity parameter to a load or the power tool through the communication terminal 11 so that the controller of the power tool may adjust the current operating state based on the discharge capacity parameter of the battery pack 100, enabling operating parameters, including the power supply current or the power supply voltage, required by the operation of the power tool to be within the allowable range of the discharge capacity parameter of the battery pack 100.

It is to be understood that with the constant discharge of the battery pack 100, parameters including the voltage of the cell 21, the internal resistance of the cell 21, and the output current of the cell group 20 vary constantly. The discharge capacity parameter of the battery pack 100 estimated by the control unit 50 based on the preceding parameters is constantly updated and varies dynamically. Accordingly, the battery pack constantly updates the discharge capacity parameter and transmits the discharge capacity parameter to the power tool, and the power tool adaptively adjusts the operating state so that the operating parameters (for example, operating current or operating voltage) required by the power tool are within the allowable range of the discharge capacity parameter. In this case, the battery pack 100 is prevented from falling into an overloaded operating state and supplies power to the power tool in the discharge state matching the discharge capacity of the battery pack 100 so that both the life of the battery pack 100 and the discharge capacity of the battery pack 100 are guaranteed.

It is to be understood that the present application is not limited to updating the discharge capacity parameter of the battery pack based on parameters including the voltage of the cell, the internal resistance of the cell, and the output current of the cell group. Methods of updating the discharge capacity parameter of the battery pack based on other parameters or in other manners all fall within the protection scope of the present application.

Figure 3:
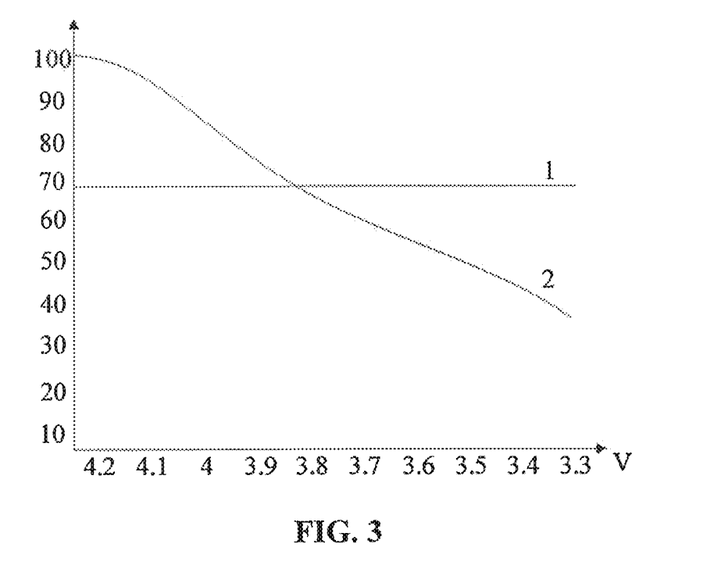
FIG. 3 is a circuit block diagram of a battery pack according to an example.

Exemplarily, FIG. 3 illustrates the process of dynamically adjusting the discharge capacity parameter of the battery pack. In the figure, an abscissa represents a value of the voltage of the cell, and an ordinate represents a value of the discharge capacity parameter of the battery pack. Line 1 indicates a fixed discharge capacity parameter initially set before adjustment. Line 2 indicates the discharge capacity parameter of the battery pack 100 dynamically varying with the voltage of the cell 21. As shown in FIG. 3, the discharge capacity of the battery pack 100 is relatively strong in an early stage when the voltage of the cell 21 is relatively high, and the discharge capacity of the battery pack 100 is relatively weak in a late stage when the voltage of the cell 21 is relatively low. The dynamic adjustment of the discharge capacity parameter may reflect the discharge capacity of the battery pack 100 in the early stage when the battery pack 100 discharges and may prevent the life of the battery pack 100 from decaying in the late stage when the battery pack 100 discharges.

In an example, the discharge capacity parameter fed back by the battery pack 100 is also related to the number of cell groups connected in parallel in the battery pack 100. It is supposed that S denotes the discharge capacity parameter and that P denotes the number of cell groups 20 connected in parallel. In this case, S=P * K. P is a positive integer greater than or equal to 1. K is related to the voltage U of the cell 21, the internal resistance R of the cell 21, and the output current I of the cell group 20.

In one example, the value of K depends on the value range of $U_{supplement}$ as below, wherein $U_{supplement}$=U+IR.

In the case where 4 V<$U_{supplement}$≤4.1 V, K=71.
In the case where 3.9 V<$U_{supplement}$≤4 V, K=66.
In the case where 3.8 V<$U_{supplement}$≤3.9 V, K=62.
In the case where 3.7 V<$U_{supplement}$≤3.8 V, K=57.
In the case where 3.6 V<$U_{supplement}$≤3.7 V, K=53.
In the case where 3.5 V<$U_{supplement}$≤3.6 V, K=48.
In the case where 3.4 V<$U_{supplement}$≤3.5 V, K=44.

Especially, in the case where $U_{supplement}$>4.1 V, K=80; and in the case where $U_{supplement}$<3.4 V, K=30.

In an optional example, the control unit 50 may set a maximum reference threshold of the discharge capacity parameter. In the process of dynamically adjusting the maximum reference threshold of the discharge capacity parameter, it guarantees that the adjusted discharge capacity parameter is smaller than or equal to the maximum threshold of the discharge capacity parameter. Accordingly, a sudden load change is prevented from triggering the power-off protection of the battery pack 100 under an excessively high discharge capacity and thus affecting the discharge performance of the battery pack 100.

It is to be noted that the preceding examples merely describe the value method of related parameters and the algorithm model when the discharge capacity parameter of one type of battery packs is estimated. It is to be understood that when the discharge capacity parameters of different types of battery packs are estimated, the selection of related parameters or the algorithm model used in the calculation may be adjusted according to an actual situation and is not limited in the present application.

Figure 4:
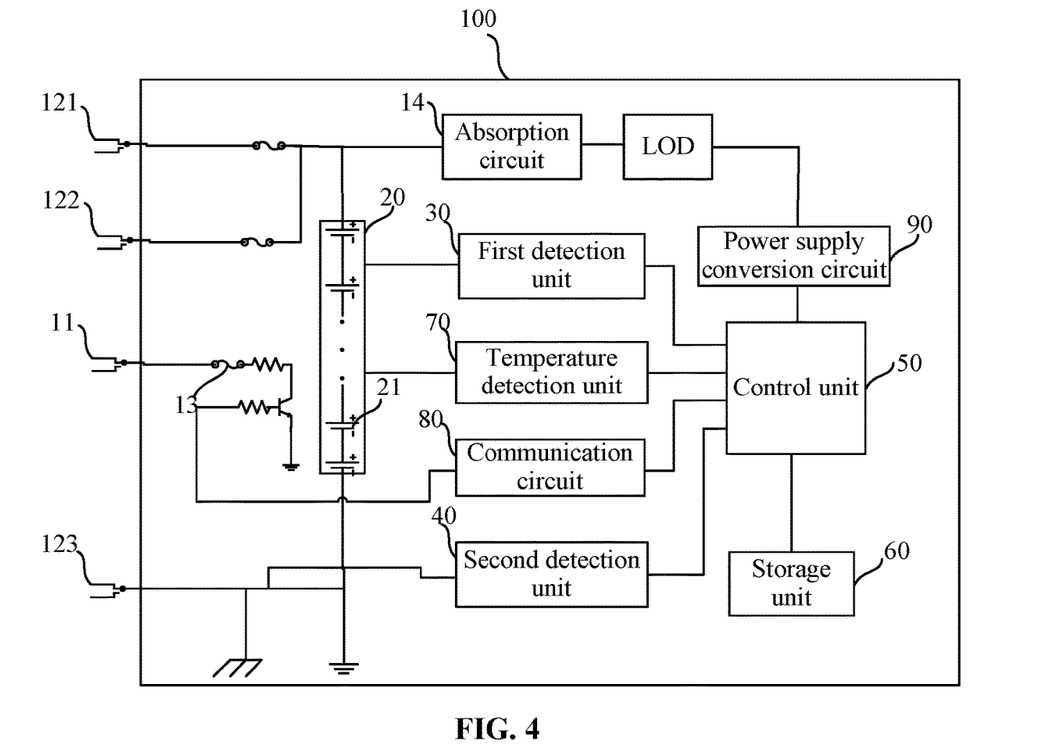
FIG. 4 is a diagram illustrating the discharge capacity of a battery pack according to an example.

In one example, as shown in FIG. 4, the charging positive terminal 122 of the battery pack 100 is provided with a protective resistor 13 which may prevent the communication terminal 11 and the charging positive terminal 122 from being short-circuited due to a large current at the charging positive terminal 122. Optionally, the protective resistor 13 may be a resettable fuse. In one example, the resettable fuse is a positive temperature coefficient resistance.

In one example, as shown in FIG. 3, the positive terminal end formed by the discharging positive terminal 121 and the charging positive terminal 122 is provided with an absorption circuit 14 to prevent a low-dropout regulator (LDO) in the battery pack 100 or related elements in the battery pack 100 from being affected by a voltage spike generated by the output voltage variation of the cell group 20. The absorption circuit 14 serves as the circuit absorbing the voltage spike. The design of the absorption circuit 14 is mature and is not described in detail in the present application.

In one example, the battery pack 100 may further include an LED circuit electrically connected to the control unit 50. The LED circuit may control the display state of an LED light to display, for example, the electric quantity information of the battery pack 100, the voltage information of the battery pack 100, or the temperature information of the battery pack 100.

Figure 5:
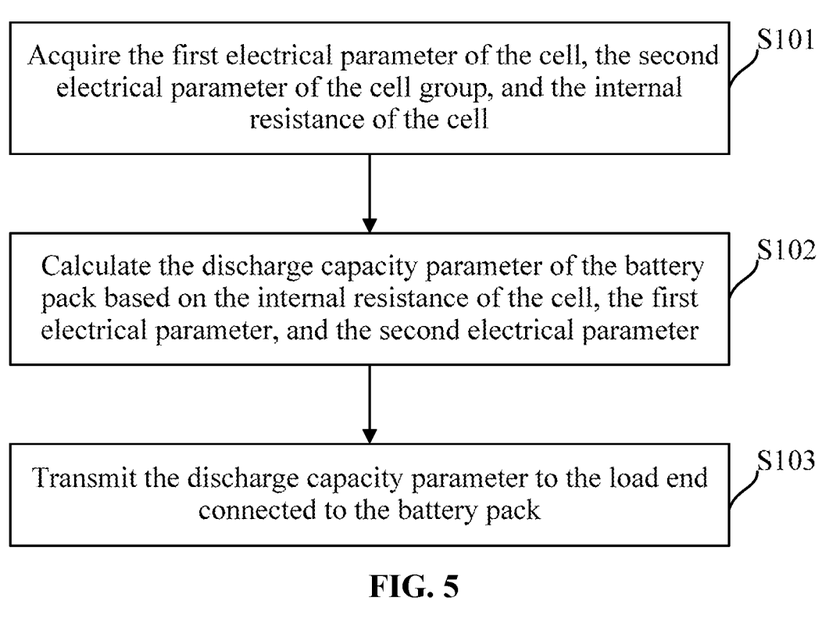
FIG. 5 is a flowchart of a method for controlling the discharge of a battery pack according to an example.

A method for controlling the discharge of the battery pack 100 is described hereinafter in conjunction with FIG. 5. The method includes the steps below.

In S101, the first electrical parameter of the cell, the second electrical parameter of the cell group, and the internal resistance of the cell are acquired. The first electrical parameter may be the voltage of a single cell, and the second electrical parameter may be the output current on the output circuit of the cell group. The acquisition of the preceding parameters may be performed in real time or at regular intervals. That is, related parameters for estimating the discharge capacity parameter of the battery pack are constantly updated. Accordingly, the estimated discharge capacity parameter of the battery pack is a dynamically updated parameter that can reflect the discharge capacity variation of the battery pack.

In S102, the discharge capacity parameter of the battery pack is calculated based on the internal resistance of the cell, the first electrical parameter, and the second electrical parameter.

In S103, the discharge capacity parameter is transmitted to the load connected to the battery pack.

It is to be understood that the load connected to the battery pack, that is the power tool, can adjust the current operating state, including adjusting operating parameters such as the current operating current and operating voltage, based on the preceding discharge capacity parameter so that the adjusted operating parameters are within the allowable range of the discharge capacity parameter.

It is to be noted that the preceding are only preferred examples of the present disclosure and technical principles used therein. It is to be understood by those skilled in the art that the present disclosure is not limited to the specific examples described herein. Those skilled in the art can make various apparent modifications, adaptations, and substitutions without departing from the scope of the present disclosure. Therefore, while the present disclosure has been described in detail through the preceding examples, the present disclosure is not limited to the preceding examples and may include other equivalent examples without departing from the concept of the present disclosure. The scope of the present disclosure is determined by the scope of the appended claims.

What is claimed is:

1. A power supply apparatus, comprising:
   a first detection unit configured to detect a first electrical parameter of the power supply apparatus;
   a second detection unit configured to detect a second electrical parameter of the power supply apparatus;
   a storage unit at least configured to store a third electrical parameter of the power supply apparatus; and
   a control unit at least electrically connected to the first detection unit, the second detection unit, and the storage unit, wherein the control unit is configured to:
   acquire the first electrical parameter, the second electrical parameter, and the third electrical parameter; and
   dynamically adjust a discharge capacity parameter of the power supply apparatus based on the first electrical parameter, the second electrical parameter, and the third electrical parameter.

2. The power supply apparatus of claim 1, wherein the control unit is further configured to transmit the discharge capacity parameter to a load connected to the power supply apparatus to enable the load to adjust a current operating state based on the discharge capacity parameter.

3. The power supply apparatus of claim 1, wherein the first electrical parameter comprises a voltage of the power supply apparatus.

4. The power supply apparatus of claim 1, wherein the second electrical parameter comprises an output current on a power supply circuit of the power supply apparatus.

5. The power supply apparatus of claim 1, wherein the third electrical parameter comprises an internal resistance of the power supply apparatus.

6. The power supply apparatus of claim 5, wherein the control unit is configured to acquire the internal resistance of the power supply apparatus by querying a table.

7. The power supply apparatus of claim 6, wherein the storage unit stores the internal resistance corresponding to the power supply apparatus at different discharge stages.

8. The power supply apparatus of claim 5, wherein the control unit is configured to estimate the internal resistance of the power supply apparatus based on a preset discharge model.

9. The power supply apparatus of claim 5, wherein the power supply apparatus comprises a battery pack, the battery pack comprises a plurality of cell groups connected in parallel or in series, and the control unit is configured to dynamically adjust the discharge capacity parameter based on a number of the plurality of the cell groups connected in parallel, the first electrical parameter, the second electrical parameter, and the internal resistance of the power supply apparatus.

10. The power supply apparatus of claim 1, wherein the first electrical parameter collected by the first detection unit is a dynamically updating parameter.

11. The power supply apparatus of claim 1, wherein the second electrical parameter collected by the second detection unit is a dynamically updating parameter.

12. The power supply apparatus of claim 1, wherein the third electrical parameter is a dynamically updating parameter.

13. A battery pack, comprising:
    a cell group comprising a plurality of cells;
    a first detection unit configured to detect a voltage of one cell of the plurality of cells;
    a second detection unit configured to detect an output current on a power supply circuit of the cell group; and
    a control unit at least electrically connected to the first detection unit and the second detection unit, wherein the control unit is configured to:
    acquire the voltage of the one cell, the output current on a power supply circuit of the cell group, and an internal resistance of the one cell; and
    dynamically adjust a discharge capacity parameter of the battery pack based on the voltage of the one cell, the output current on the power supply circuit of the cell group, and the internal resistance of the one cell.

14. The battery pack of claim 13, wherein the control unit is configured to acquire the internal resistance of the one cell by querying a table.

15. The battery pack of claim 13, wherein the control unit is configured to estimate the internal resistance of the one cell based on a preset cell discharge model.

16. The battery pack of claim 13, wherein the battery pack comprises a plurality of the cell groups connected in parallel or in series and the control unit is configured to dynamically adjust the discharge capacity parameter based on a number of the plurality of the cell groups connected in parallel, the voltage of the one cell, the output current on a power supply circuit of the cell group, and the internal resistance of the one cell.

17. The battery pack of claim 13, wherein the voltage of the one cell collected by the first detection unit is a dynamically updating parameter.

18. The battery pack of claim 13, wherein the output current on the power supply circuit of the cell group collected by the second detection unit is a dynamically updating parameter.

19. The battery pack of claim 13, wherein the internal resistance of the one cell is a dynamically updating parameter.

20. A method for calculating a discharge capacity of a power supply apparatus, comprising:
    acquiring a first electrical parameter of the power supply apparatus, a second electrical parameter of the power supply apparatus, and a third electrical parameter of the power supply apparatus;
    dynamically adjusting a discharge capacity parameter of the power supply apparatus based on the first electrical parameter of the power supply apparatus, the second electrical parameter of the power supply apparatus, and the third electrical parameter of the power supply apparatus; and
    transmitting the discharge capacity parameter to a load connected to the power supply apparatus to enable the load to adjust a current operating state based on the discharge capacity parameter.

* * * * *